United States Patent [19]
Donohoe et al.

[11] Patent Number: 5,986,347
[45] Date of Patent: Nov. 16, 1999

[54] PROCESSING METHODS OF FORMING CONTACT OPENINGS AND INTEGRATED CIRCUITRY

[75] Inventors: Kevin G. Donohoe; Kirk D. Prall, both of Boise, Id.

[73] Assignee: Micron Technology, Inc., Boise, Id.

[21] Appl. No.: 09/107,930

[22] Filed: Jun. 30, 1998

Related U.S. Application Data

[62] Division of application No. 08/911,311, Aug. 14, 1997.
[51] Int. Cl.⁶ .............................. H01L 23/48; H01L 29/46
[52] U.S. Cl. ......................... 257/774; 257/758; 257/760; 257/308
[58] Field of Search .................................. 257/774, 758, 257/760, 308

[56] References Cited

U.S. PATENT DOCUMENTS

| | | | |
|---|---|---|---|
| 4,488,166 | 12/1984 | Lehrer | 257/774 |
| 5,094,900 | 3/1992 | Langley | 257/774 |
| 5,180,689 | 1/1993 | Liu et al. | 437/228 |
| 5,408,130 | 4/1995 | Woo et al. | 257/774 |
| 5,451,819 | 9/1995 | Koyama | 257/774 |
| 5,468,342 | 11/1995 | Nulty et al. | 156/643.1 |
| 5,665,623 | 9/1997 | Liang et al. | 438/239 |

OTHER PUBLICATIONS

A. Shinohara et al., "A New Self–Aligned Contact Technology for LLD MOS Transistors", Extended Abstracts of the 17th Conference on Solid State Devices and Materials, Tokyo, Japan, 1985, pp. 12–15.

*Primary Examiner*—Teresa M. Arroyo
*Assistant Examiner*—Hung Van Duong
*Attorney, Agent, or Firm*—Wells, St. John, Roberts, Gregory & Matkin P.S.

[57] ABSTRACT

Methods of forming contact openings over a node location and related integrated circuitry are described. In one aspect of the invention, a node location is formed within a semiconductive substrate adjacent an isolation oxide region. A layer of material is formed over the node location and a contact opening is etched through the layer of material to outwardly expose a node location planar upper surface. In one preferred implementation, the contact opening includes an inner surface portion which faces generally transversely away from the isolation oxide region and which defines an angle with the node location upper surface which is greater at a bottom of the contact opening than at a top of the contact opening. In another preferred implementation, the contact opening includes sidewall portions which define a profile which having a non-uniform degree of taper between the contact opening top and bottom. In another preferred implementation, the tapering of the contact opening is effectuated by modifying at least one etching parameter at an intermediate etching point and continuing the etching to outwardly expose the node location.

7 Claims, 5 Drawing Sheets

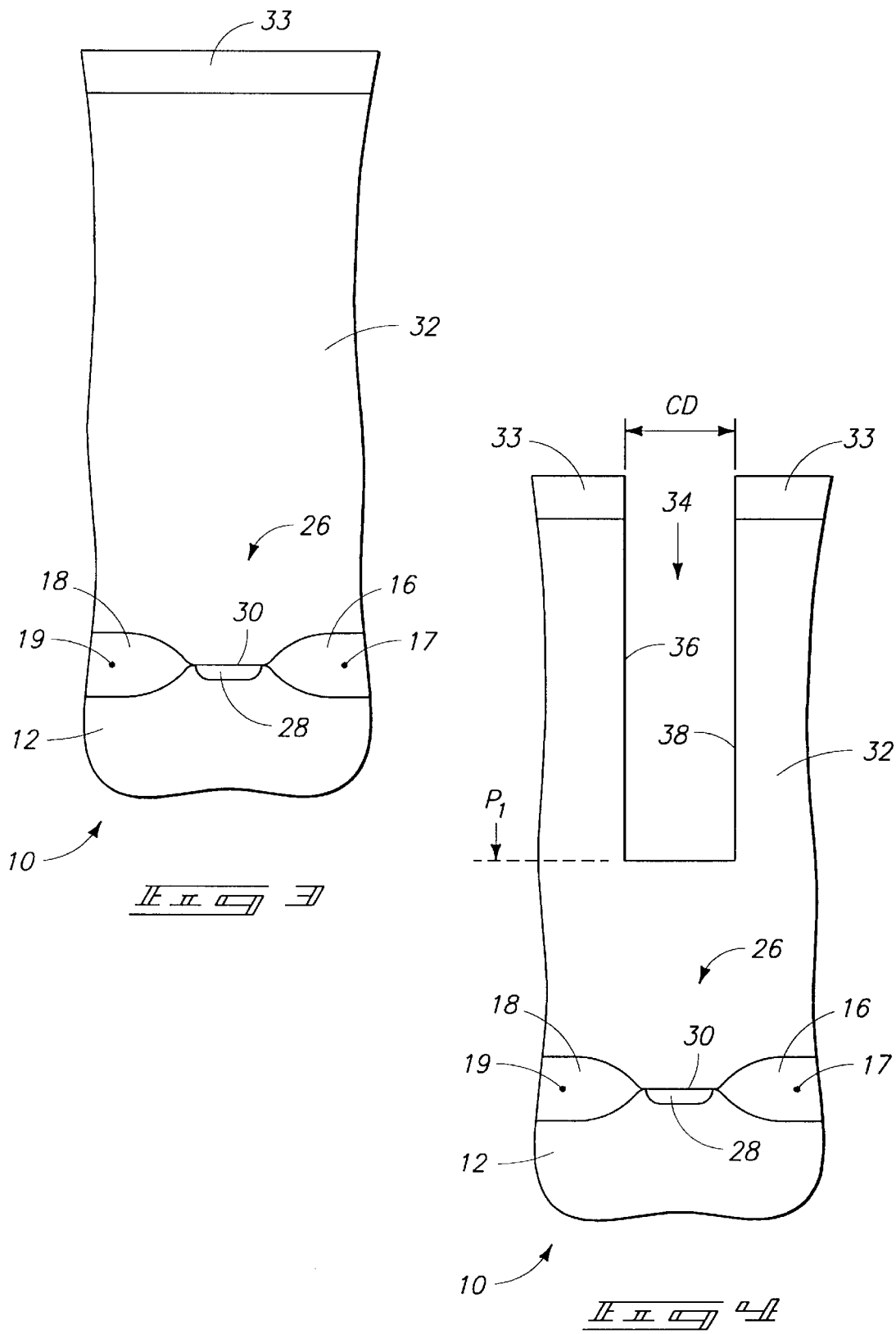

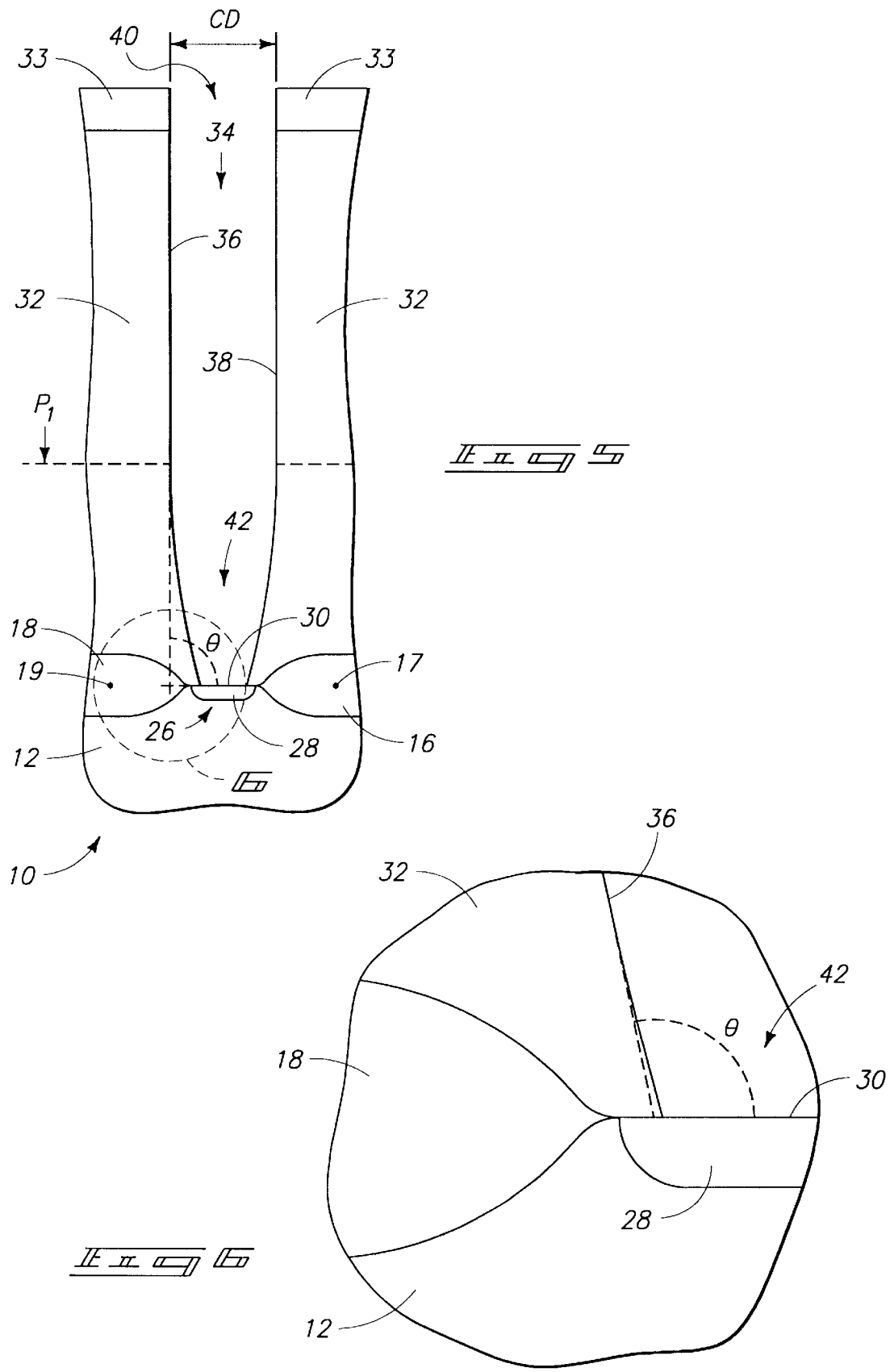

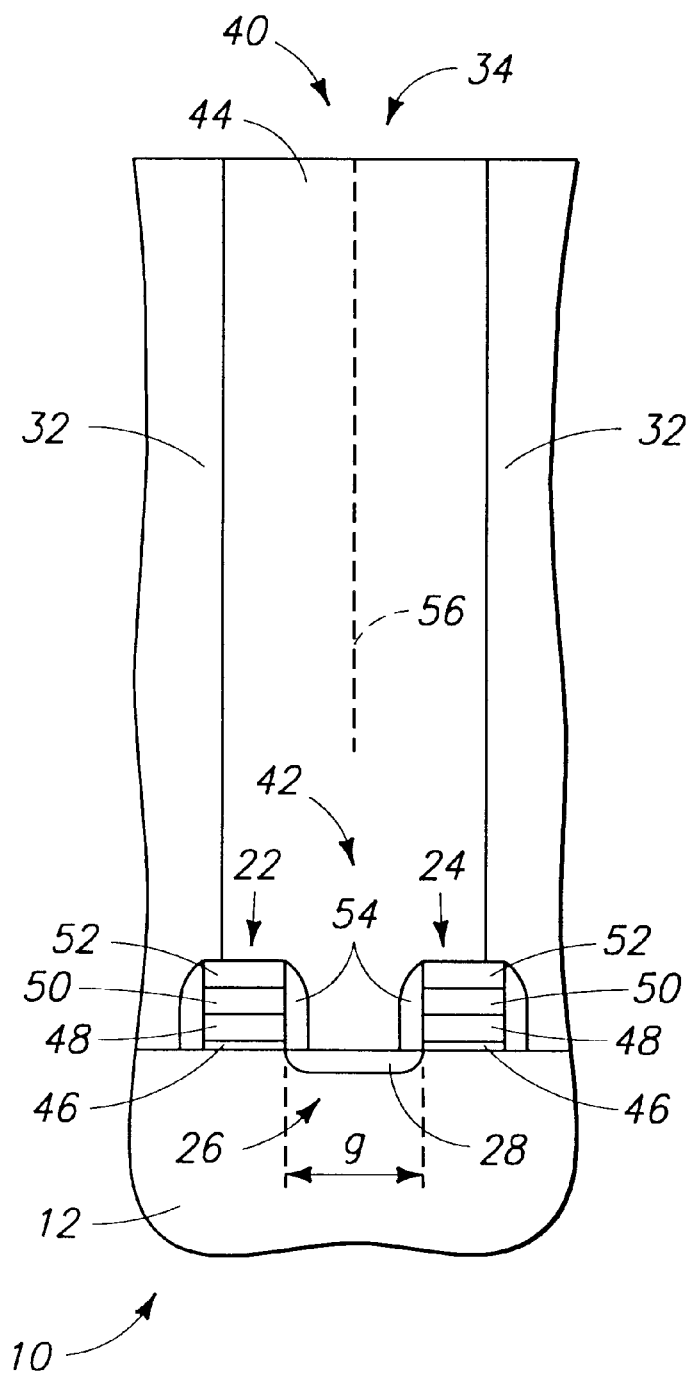

5,986,347

PROCESSING METHODS OF FORMING CONTACT OPENINGS AND INTEGRATED CIRCUITRY

RELATED PATENT DATA

This patent resulted from a divisional application of U.S. patent application Ser. No. 08/911,311, filed Aug. 14, 1997, entitled "Processing Methods of Forming Contact Openings and Integrated Circuitry", naming Kevin G. Donohoe and Kirk D. Prall as inventors.

TECHNICAL FIELD

This invention relates to methods of forming contact openings and related integrated circuitry.

BACKGROUND OF THE INVENTION

Fabrication of integrated circuitry typically involves forming contact openings through an insulative layer to an elevationally lower substrate node location, such as a diffusion region which constitutes part of a field effect transistor. Typically, field effect transistors are fabricated on a semiconductor wafer, with selected individual transistors being separated by isolation oxide or field oxide regions. As integrated circuitry dimensions grow smaller and smaller, challenges are presented with respect to the formation of contact openings to substrate node locations.

For example, one type of integrated circuitry is a dynamic random access memory device which includes a plurality of isolation oxide regions over which conductive word lines extend. Conductive word lines are usually covered or insulated with protective nitride caps and sidewalls. A thick layer of oxide typically overlies the word lines. A contact opening etch can be conducted selective relative to the protective caps and sidewalls to achieve self-alignment of the contact opening in a direction perpendicular to the line. However, because such word lines typically overlie isolation oxide regions, and because the insulative layer through which the contact opening is etched usually etches in the same manner as the material from which the isolation oxide regions are formed, e.g. when both are oxides, a problem arises insofar as undesirably etching into the isolation oxide region when the contact openings are formed.

This invention arose out of concerns associated with improving the manner in which contact openings are formed in integrated device fabrication.

SUMMARY OF THE INVENTION

Methods of forming contact openings over a node location and related integrated circuitry are described. In one aspect of the invention, a node location -is formed within a semiconductive substrate adjacent an isolation oxide region. A layer of material is formed over the node location and a contact opening is etched through the layer of material to outwardly expose a node location planar upper surface. In one preferred implementation, the contact opening includes an inner surface portion which faces generally transversely away from the isolation oxide region and which defines an angle with the node location upper surface which is greater at a bottom of the contact opening than at a top of the contact opening. In another preferred implementation, the contact opening includes sidewall portions which define a profile which has a non-uniform degree of taper between the contact opening top and bottom. In another preferred implementation, the tapering of the contact opening is effectuated by modifying at least one etching parameter at an intermediate etching point and continuing the etching to outwardly expose the node location.

BRIEF DESCRIPTION OF THE DRAWINGS

Preferred embodiments of the invention are described below with reference to the following accompanying drawings.

FIG. 3 is a view of the FIG. 2 wafer fragment at a processing step subsequent to that shown by FIG. 2.

FIG. 4 is a view of the FIG. 2 wafer fragment at a processing step subsequent to that shown by FIG. 3.

FIG. 5 is a view of the FIG. 2 wafer fragment at a processing step subsequent to that shown by FIG. 4.

FIG. 6 is a view of the FIG. 2 wafer fragment at a processing step subsequent to that shown by FIG. 5.

FIG. 7 is a view of the FIG. 2 wafer fragment at a processing step subsequent to that shown by FIG. 6.

FIG. 8 is a view of the FIG. 1 wafer fragment taken along line 8—8 in FIG. 1 at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
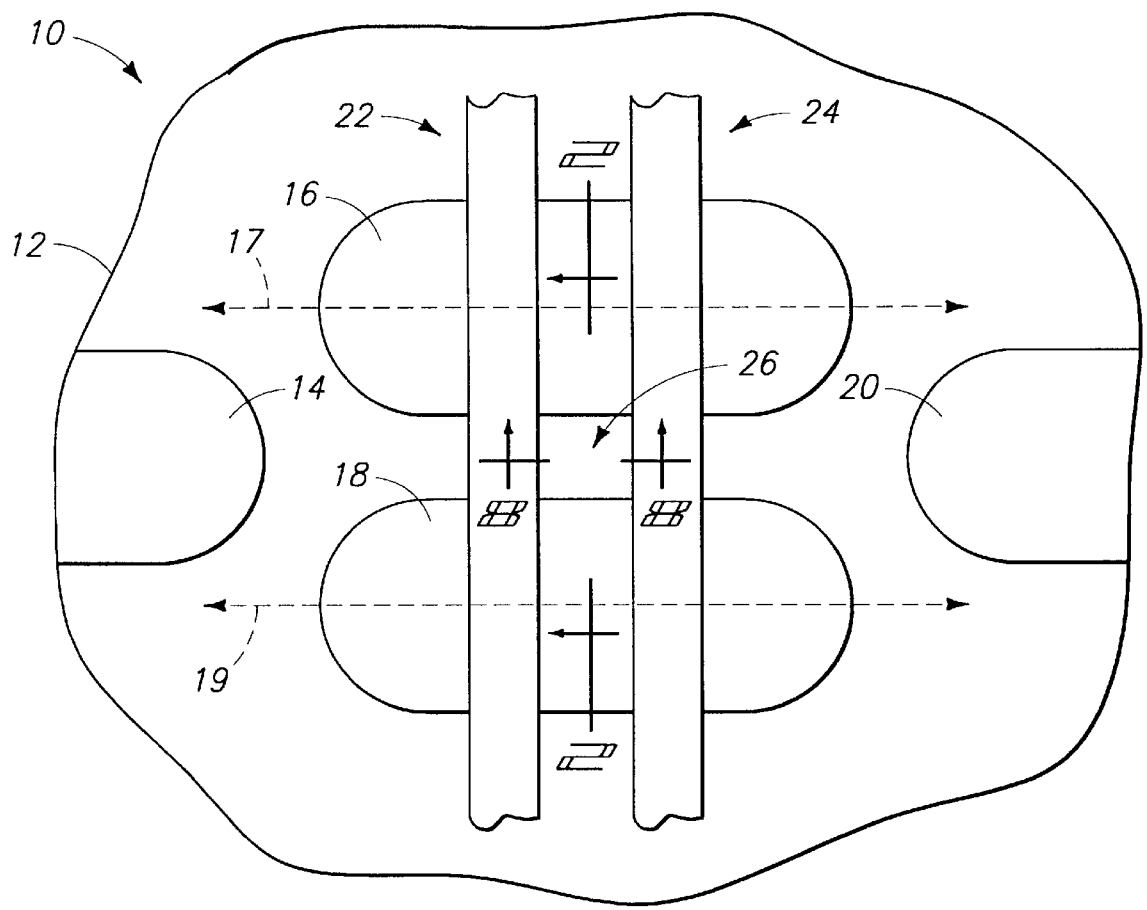
FIG. 1 is a plan view of a semiconductor wafer fragment at one processing step in accordance with the invention.
Figure 2:
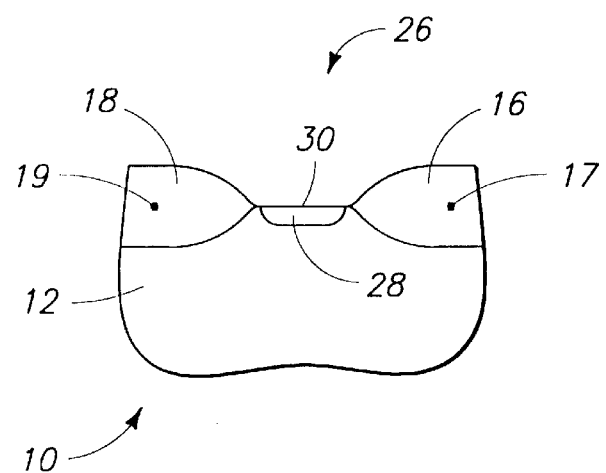
FIG. 2 is a view of the semiconductor wafer fragment taken along line 2—2 in FIG. 1.
Figure 11:
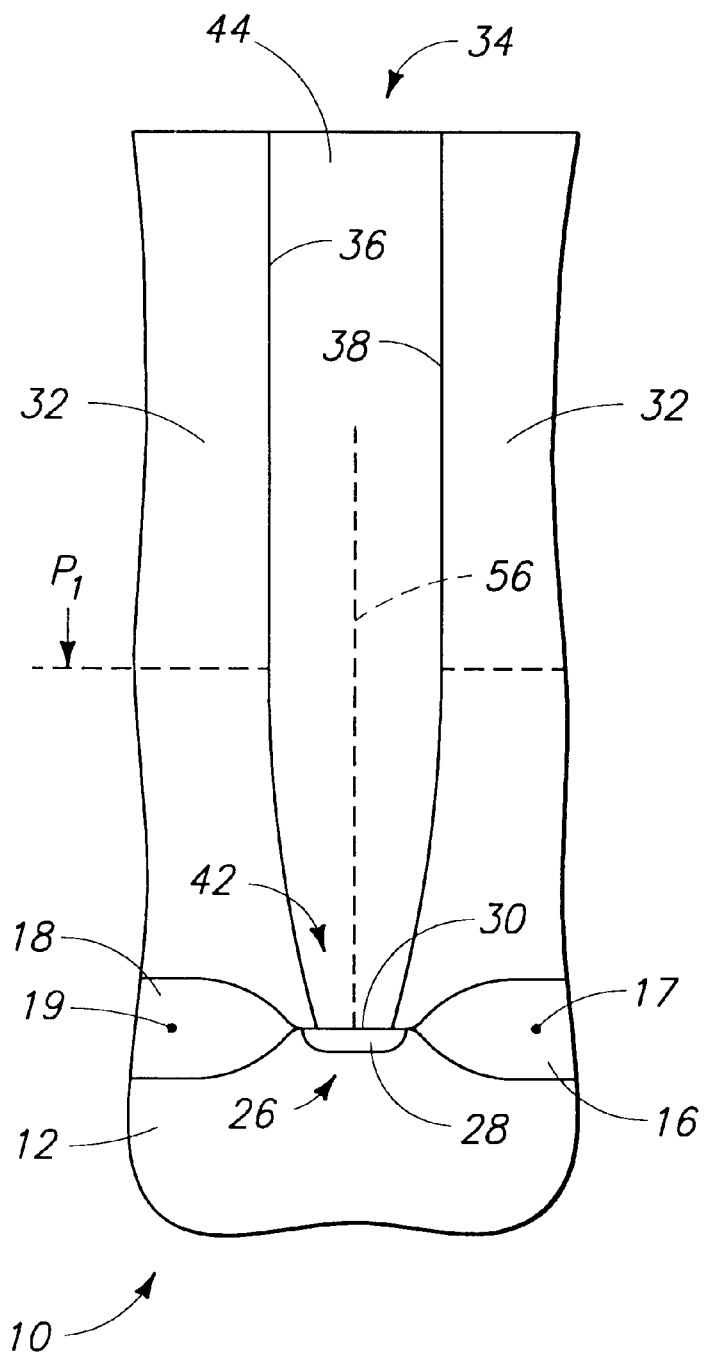

Referring to FIGS. 1 and 2, a semiconductor wafer fragment in process is shown generally at 10 and comprises a semiconductive substrate 12. In the context of this document, the term "semiconductive substrate" is defined to mean any construction comprising semiconductive material, including but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the illustrated example, an 8-inch wafer was used as the substrate.

A plurality of isolation oxide regions 14, 16, 18, and 20 are formed within substrate 12. The isolation oxide regions are preferably formed through suitable oxidation of substrate 12 through LOCOS techniques. In the illustrated example, the isolation oxide regions are spaced apart over substrate 12 and are formed along longitudinal axes, individual respective axes for isolation regions 16, 18 being indicated at 17, 19. Isolation oxide regions 16, 18 constitute a pair of spaced apart isolation oxide regions whose respective longitudinal axes 17, 19 are generally or substantially parallel to one another.

Referring to FIGS. 1, 2, and 8, a pair of laterally spaced apart conductive lines 22, 24 are formed over substrate 12 and oriented generally transversely of longitudinal axes 17, 19. In the illustrated example, conductive lines 22, 24 overlie respective isolation oxide regions 16, 18. Such conductive lines typically include, as shown in FIG. 8, a thin oxide layer 46, conductive layers 48, 50 (typically comprising polysilicon and a silicide layer respectively), and a protective cap or capping layer 52. Sidewall spacers 54 are also provided. Other conductive line constructions are possible. According to one implementation of the invention, caps 52 and spacers 54 comprise a nitride material which protects the conductive portions of the lines during a subsequent contact opening etch discussed in more detail below. In the illustrated and preferred embodiment, the conductive lines are formed to an elevational thickness of about 2000–3000 Angstroms (not including the elevational thickness of the nitride caps). The preferred nitride caps are formed to an elevational thickness of about 3000 Angstroms so that the total elevational thickness of the individual conductive lines with nitride caps is around about 5000–6000 Angstroms. Additionally, the gap g (FIG. 8) between lines 22, 24 is preferably around 2500 Angstroms or less.

A node location 26 is formed within substrate 12 adjacent respective isolation oxide regions 16, 18 and adjacent respective conductive lines 22, 24. In the illustrated and preferred embodiment, node location 26 constitutes a diffusion region 28 (FIG. 2) having a generally planar upper surface 30.

Referring to FIG. 3, a layer of material 32 is formed over substrate 12. Accordingly, layer 32 is formed over and outwardly of node location 26, isolation oxide regions 16, 18, and conductive lines 22, 24 (FIG. 1). A suitable material for layer 32 comprises borophosphosilicate glass (BPSG). An exemplary thickness is about 18,000 Angstroms. Alternately considered and in accordance with one implementation, layer 32 is formed to a thickness over the illustrated conductive lines (FIG. 8) of at least 3000 Angstroms, and preferably greater than 4000 Angstroms. A masking material layer 33, preferably comprising photoresist, is subsequently formed over the substrate.

Referring to FIG. 4, photoresist layer 33 is patterned and an opening 34 which constitutes a portion of a contact opening is etched into layer 32 to an intermediate etching point $P_1$. The patterning of opening 34 defines an opening lateral width or critical dimension (CD). In the illustrated example, the patterned lateral width of the opening at this point in the etching (i.e. at or adjacent the top of opening 34) is about 0.4 μm. The lateral width of the contact opening taken in a direction into the page which is transverse to conductive lines 22, 24 in FIG. 1 is about 0.7 μm. Such a transverse lateral width is shown in FIG. 8. Intermediate etching point $P_1$ can be any intermediate etching point between the beginning of the etching which forms the contact opening portion and node location 26. The etching of opening 34 defines respective contact opening sidewall portions 36, 38. In this example, the illustrated sidewall portions 36, 38 overlie respective isolation oxide regions 18, 16. The preferred etching of the contact opening is conducted in a LAM 9100 etcher and an exemplary etch or etching chemistry which is suitable for conducting this etch is one which is conducted in accordance with the following parameters: 1100 Watts (power applied to an external reactor electrode), 1900 Watts (power applied to an internal wafer carrier), 43 $CHF_3$, 20 $C_2HF_5$, 1 $C_2F_6$ (units in sccm), 5 mTorr, and 35 seconds. Such etching parameters permit the illustrated opening to be formed to just proximate the nitride caps covering conductive lines 22, 24 (FIG. 1).

Referring to FIG. 5, and in the illustrated and preferred embodiment, at least one etching parameter is modified at or adjacent etching point $P_1$ to taper selected individual contact opening sidewall portions 36, 38 generally transversely away from the nearest respective longitudinal axis 19, 17 of corresponding isolation oxide regions 18, 16. Such etch preferably outwardly exposes node location 26. An exemplary etch or etching chemistry which is suitable for conducting this etch is one which is conducted in accordance with the following parameters: 1000 Watts (power applied to the external reactor electrode), 2150 Watts (power applied to the internal wafer carrier), 20 $CHF_3$, 90 $C_2HF_5$, 5 $C_2F_6$ (units in sccm), 5 mTorr, and 45 seconds. Such etch is preferably increasingly selective to nitride and results in the illustrated tapering of the contact opening. In the preferred embodiment, the etching of the contact opening constitutes etching the contact opening to taper the illustrated sidewall portions in the absence of individual contact opening sidewall contact with any substrate structure. In addition, the etching of the illustrated contact opening preferably does not meaningfully increase the patterned lateral width or CD of the contact opening at or adjacent the top thereof. Accordingly, the illustrated and preferred contact opening has a lateral width dimension adjacent the contact opening top which is essentially equivalent to the original patterned lateral width dimension. Such etching of the contact opening constitutes etching a contact opening, at least of portion of which gradually tapers, without the etching increasing the patterned lateral width or critical dimension of the contact opening. Alternately considered, the patterned lateral width dimension or CD is generally maintained during the etching of the contact opening. Alternately considered, the contact opening has an initial lateral width dimension adjacent the contact opening top which is generally maintained during the etching of the contact opening. Such is different from known etching regimes in which photoresist erosion is utilized to increase the CD of the upper portion of a contact opening when forming the same.

Another exemplary etch or etching chemistry for the above-mentioned LAM 9100 etcher is a multiple-step process which is conducted in accordance with the following parameters: Step 1—1100 Watts (power applied to the external reactor electrode), 1900 Watts (power applied to the internal wafer carrier), 61 $CHF_3$, 11.5 $C_2HF_5$, 1 $CH_2F_2$ (units in sccm), 10 mTorr, and 7 seconds; Step 2—1100 Watts (power applied to the external reactor electrode), 900 Watts (power applied to the internal wafer carrier), 61 $CHF_3$, 11.5 $C_2HF_5$, 1 $CH_2F_2$, 10 mTorr, and 18 seconds; Step 3—1000 Watts (power applied to the external reactor electrode), 1600 Watts (power applied to the internal wafer carrier), 49 $CHF_3$; 23 $C_2HF_5$, 5 $CH_2F_2$, 5 mTorr, and 5 seconds; Step 4—1000 Watts (power applied to the external reactor electrode), 2150 Watts (power applied to the internal wafer carrier), 49 $CHF_3$, 23 $C_2HF_5$, 5 $CH_2F_2$, 5 mTorr, and 30 seconds; and Step 5—1000 Watts (power applied to the external reactor electrode), 1500 Watts (power applied to the internal wafer carrier), 49 $CHF_3$, 34.5 $C_2HF_5$, 5 $CH_2F_2$, 2 mTorr, and 49 seconds. Other processes having more or less steps can be utilized. One such exemplary process utilizes two steps and is as follows: Step 1—1500 Watts (power applied to the external reactor electrode), 1400 Watts (power applied to the internal reactor electrode), 16 $C_2HF_5$ (units in sccm), 50 $CHF_3$, 1 $CH_2F_2$, 120 Argon, 5 mTorr, and 35 seconds; Step 2—1000 Watts (power applied to the external reactor electrode), 1375 Watts (power applied to the internal reactor electrode), 45 $C_2HF_5$ (units in sccm), 35 $CHF_3$, 20 $CH_2F_2$, 2 mTorr, and 80 seconds. As formed, contact opening 34 has a contact opening top 40 and a contact opening bottom 42 and an aspect ratio (contact opening height-to-width ratio) of from about 5–30, and preferably around 10. The preferred contact opening also has a degree of taper which is defined between contact opening top 40 and contact opening bottom 42. As shown, the degree of taper is one which varies the width of the contact opening and preferably results in a contact opening profile with a degree of concavity which is greater nearest contact opening bottom 42 than adjacent contact opening top 40. In the illustrated and preferred embodiment, the degree of taper arcuately varies, increasing as the contact opening reaches node location 26 proximate the bottom most portion of contact opening bottom 42. An exemplary contact opening width adjacent contact opening bottom 42 of FIG. 5 is around 0.2 μm.

Alternately considered, contact opening 34 as shown in FIG. 5 defines a profile which lies in or along a plane which is taken through the contact opening and which is both generally transverse the isolation oxide regions' longitudinal axes 17, 19, (FIG. 1) and generally transverse the node location planar upper surface 30. Such profile is also taken through the contact opening and in a plane which is parallel to either of conductive lines 22, 24 (FIG. 1). Such profile, when viewed from top-to-bottom, includes a profile portion which tapers generally arcuately toward node location 26. The illustrated profile defines a non-uniform degree of taper between contact opening top 40 and contact opening bottom 42. The contact opening is preferably narrower at or adjacent contact opening bottom 42 than at or adjacent contact opening top 40. As formed, the contact opening profile is generally bowed arcuately inwardly proximate contact opening bottom 42.

Alternately considered and with reference to FIGS. 5 and 6, contact opening 34 includes a pair of inner surface portions which correspond to sidewall portions 36, 38. The inner surface portions face generally transversely away from the respective nearest of the isolation oxide regions' longitudinal axes 19, 17, and extend between contact opening top 40 and contact opening bottom 42. Inner surface portions 36, 38 define an angle with node location upper surface 30. A representative angle θ is shown for inner surface portion 36 at two different locations relative to the contact opening. A first location is shown in FIG. 5 and corresponds to the angle formed between inner surface portion 36 and node location planar surface 30 adjacent contact opening top 40. A second location is shown in FIG. 6 and corresponds to the angle formed between inner surface portion 36 and node location planar surface 30 adjacent contact opening bottom 42. The angle θ is greater adjacent contact opening bottom 42 (FIG. 6) than at or adjacent contact opening top 40 (FIG. 5). As shown in FIG. 5, θ is generally around about 90°. As shown in FIG. 6, however, θ is generally greater than 90°. Accordingly, the contact opening inner surface portions 36, 38 generally taper between the contact opening top and bottom and have generally arcuate bottom regions into the direction of node location upper surface 30. Such tapering effectively minimizes or eliminates etching into isolation regions 16, 18 when the contact opening is formed.

Referring to FIG. 7, a plug 44 of conductive material is formed or disposed within contact opening 34 and forms an electrical connection with node location 26.

Alternately considered, and with reference to FIGS. 1, 7 and 8, a multi-directional, self-aligned contact opening 34 is formed over node location 26. According to one aspect of the invention, a first material 32 (FIG. 3) through which a contact opening is to be etched is formed over the substrate. Substrate 12 includes at least one substrate feature which comprises a second material and over which first material 32 is formed. In a preferred implementation, the substrate feature comprises a conductive line such as exemplary line 22, or exemplary line pairs 22, 24. The second material is preferably different from first material 32 and accommodates and facilitates self-alignment of the contact opening in a first alignment direction. An exemplary first alignment direction is illustrated in FIG. 8 and is defined, in part, by the plane of the page upon which FIG. 8 appears, and corresponds to line 8—8 in FIG. 1. Where first material 32 comprises an oxide material such as BPSG, the second material can comprise a nitride material such as the material which is utilized to form spacers 54 and/or caps 52. Exemplary oxides for first material 32 also include silicon suboxide ($SiO_{<2}$) and $SiO_2$. Exemplary nitride material for the second material includes $Si_zO_xN_y$, such as $Si_3N_4$. Other materials are, of course, possible.

Contact opening 34 is preferably etched through first material 32 to expose node location 26. As so etched, the contact opening has sidewalls which, in one implementation, include portions in the first alignment direction (FIG. 8) which comprise the second material from which spacers 54 are formed. FIG. 7 illustrates a second alignment direction which is different from the first alignment direction. The illustrated second alignment direction is defined, in part, by the plane of the page upon which FIG. 7 appears, and corresponds to line 2—2 in FIG. 1. The illustrated second alignment direction is generally transverse the first alignment direction. In accordance with one implementation, the etched contact opening includes a contact opening center 56 and selected portions of the contact opening curve inwardly toward the contact opening center in the second alignment direction of FIG. 7. In a preferred implementation, the selected portions of the contact opening which curve inwardly do so at an increasing rate as the contact opening reaches contact opening bottom 42. Bottom portions of the illustrated and preferred inwardly curved portions of FIG. 7 are disposed laterally adjacent the illustrated contact opening second material portions 54 of FIG. 8. It will be appreciated that contact openings having other profiles in the first and second directions can be formed. For example, referring to FIG. 8, a contact opening can be formed to have a profile which comprises portions of only one of the illustrated conductive lines. An exemplary contact opening could, accordingly, have one of its sidewalls formed along line 56.

In accordance with one implementation, the above-described contact opening is etched utilizing a first set of etching parameters which enables at least a portion of the contact opening to be etched. At some point in the etching of the contact opening, at least one of the etching parameters is changed and additional portions of the contact opening are etched. One effect of changing the etching parameters is that the above-described FIG. 7 contact opening selected portions taper or curve inwardly on themselves and toward contact opening center 56. Exemplary etching parameters are discussed above in more detail. Hence, in accordance with the methodology described immediately above, a self-aligned contact opening which enables alignment in multiple directions is achieved.

The above described methodology has particular application in connection with the fabrication of integrated circuit memory devices, and in particular with 256M DRAM circuitry. In such case, the etching of the illustrated contact opening could constitute etching a bit line contact opening, a capacitor container opening, or some other opening to a substrate node location. Other areas of application are possible.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An integrated circuitry device comprising:

a semiconductive substrate;

a field isolation oxide region received within the substrate and having a longitudinal axis;

a node location received within the substrate adjacent the field isolation oxide region and having a generally planar upper surface;

a layer of insulating material disposed over the substrate;

a contact opening to the node location received within the layer of insulating material, the contact opening having a top and a bottom within the layer of insulating material and a contact opening inner surface portion within the layer of insulating material which faces generally transversely away from the isolation oxide longitudinal axis and which extends between the top and bottom within the layer of insulating material, the contact opening inner surface portion joining with the generally planar upper surface of the node location and defining an angle with the node location generally planar upper surface which is greater at the contact opening bottom within the layer of insulating material than at the contact opening top within the layer of insulating material; and conductive material disposed within the contact opening and forming an electrical connection with the node location.

2. The integrated circuitry device of claim 1, wherein the contact opening inner surface portion generally tapers between the contact opening top and bottom.

3. The integrated circuitry device of claim 1, wherein the contact opening inner surface portion is bowed inwardly proximate the node location upper surface.

4. The integrated circuitry device of claim 1 further comprising:

a second field isolation oxide region received within the substrate and having a longitudinal axis which is generally parallel to the first mentioned longitudinal axis; and a second contact opening inner surface portion which faces generally away from the longitudinal axis of the second isolation oxide region and toward the first mentioned contact opening inner surface portion, the second contact opening inner surface portion defining an angle with the node location upper surface which is greater at the contact opening bottom than at the contact opening top.

5. The integrated circuitry of claim 1, wherein there is only insulating material between the entirety of the conductive material within the contact opening and the field isolation oxide region.

6. An integrated circuitry device comprising:

a semiconductive substrate;

a field isolation oxide region received within the substrate and having a longitudinal axis;

a node location received within the substrate adjacent the field isolation oxide region and having a generally planar upper surface;

a single layer of insulating material disposed over the substrate;

a contact opening to the node location received within the single layer of insulating material, the contact opening having a top and a bottom within the single layer of insulating material and a contact opening inner surface portion within the single layer of insulating material which faces generally transversely away from the isolation oxide longitudinal axis and which extends between the top and bottom within the single layer of insulating material, the contact opening inner surface portion joining with the generally planar upper surface of the node location and defining an angle with the node location generally planar upper surface which is greater at the contact opening bottom within the single layer of insulating material than at the contact opening top within the single layer of insulating material; and conductive material disposed within the contact opening and forming an electrical connection with the node location, and wherein there is no conductive line disposed between the entirety of the conductive material within the contact opening and the field isolation oxide region.

7. The integrated circuitry device of claim 6 further comprising a second field isolation oxide region received within the substrate and having a longitudinal axis and being spaced from the first-mentioned field isolation oxide region, and wherein there is no conductive material disposed between the entirety of the conductive material within the contact opening and the second field isolation oxide region.

* * * * *